US005671064A

United States Patent [19]

Buechler

[11] Patent Number: 5,671,064

[45] Date of Patent: Sep. 23, 1997

[54] METHOD AND APPARATUS FOR ENGRAVING USING A MAGNETOSTRICTIVE ACTUATOR

[75] Inventor: Lester W. Buechler, Dayton, Ohio

[73] Assignee: Ohio Electronic Engravers, Inc., Dayton, Ohio

[21] Appl. No.: 433,083

[22] Filed: May 3, 1995

Related U.S. Application Data

[63] Continuation of Ser. No. 334,740, Nov. 4, 1994, Pat. No. 5,491,559.

[51] Int. Cl.[6] .............................. B41C 1/02; H01L 41/06

[52] U.S. Cl. .............................. 358/299; 310/26

[58] Field of Search .............................. 358/299; 310/26

[56] References Cited

U.S. PATENT DOCUMENTS

| | | | |
|---|---|---|---|
| 3,770,888 | 11/1973 | de Vos et al. | 178/6.6 B |
| 4,308,474 | 12/1981 | Savage et al. | 310/26 |
| 4,451,856 | 5/1984 | Buechler | 358/299 |
| 4,609,404 | 9/1986 | Marraccini et al. | 106/288 Q |
| 4,642,802 | 2/1987 | Pozzo et al. | 367/168 |
| 4,770,704 | 9/1988 | Gibson et al. | 75/652 M |
| 4,805,312 | 2/1989 | Datwyler | 33/18.1 |
| 4,818,304 | 4/1989 | Verhoeven et al. | 148/103 |
| 4,849,034 | 7/1989 | Verhoeven et al. | 148/100 |
| 5,029,011 | 7/1991 | Fraser | 358/299 |
| 5,039,894 | 8/1991 | Teter et al. | 310/26 |
| 5,424,845 | 6/1995 | Holowko et al. | 358/299 |
| 5,438,422 | 8/1995 | Holowko et al. | 358/299 |

FOREIGN PATENT DOCUMENTS

| | | |
|---|---|---|
| 1272500 | 10/1989 | Japan . |
| 6270592 | 9/1994 | Japan . |

OTHER PUBLICATIONS

Application Manual for the Design of ETREMA Terfenol–D Magnetostrictive Transducers, 1988.

*Primary Examiner*—Eric Frahm

*Attorney, Agent, or Firm*—Jacox, Meckstroth & Jenkins

[57] ABSTRACT

An engraving head apparatus and method for engraving a gravure cylinder. The engraving head apparatus including a magnetostrictive actuator formed from TERFENOL-D™ which elongatably drives a diamond-tipped stylus arm in a reciprocal manner in response to a varying magnetic field created by a bias coil and a drive coil. The bias coil establishes a DC biasing magnetic field which causes an initial expansion of the actuator to approximately one-half the total linear expansion limit of the actuator. The drive coil is concentrically interposed between the actuator and the bias coil and modulates the magnetic field intensity established by the bias coil to cause additional expansion and contraction of the actuator about the initial expansion point.

53 Claims, 11 Drawing Sheets

METHOD AND APPARATUS FOR ENGRAVING USING A MAGNETOSTRICTIVE ACTUATOR

Related Application

This application is a continuation of application Ser. No. 08/334,740 filed Nov. 4, 1994, U.S. Pat. No. 5,491,559.

FIELD OF THE INVENTION

This invention relates to an engraver and, more particularly, to an engraver having an engraving head comprising a magnetostrictive actuator for driving a cutting tool or stylus in response to a magnetic field.

BACKGROUND OF THE INVENTION

Some gravure engravers of the past included one or more engraving heads which have a diamond stylus mounted on an arm projecting from a torsionally oscillated actuator shaft. A sine wave driving signal is applied to a pair of opposed electromagnets to rotate the actuator shaft through a maximum arc of approximately 0.25° at a maximum frequency of between 3 to 5 KHz. When torsionally oscillated, the actuator shaft moves the diamond stylus into and out of a copper-plated surface of a gravure cylinder to form or cut holes or cells in the cylinder surface. Gravure cylinders range in size from 6 inches to 15 feet in length, and 4 to 26 inches in diameter. Typically, 20,000 to 50,000 cells per square inch are engraved on a gravure cylinder.

Present engraving heads can produce about 3200 cells per second on the surface of a gravure cylinder when operating at about 3.2 KHz. Thus, the time required to completely engrave a cylinder is typically on the order of hours. The operating frequency for present engraving heads is limited by the mass of the magnetic material used to actuate the stylus. The engraving heads shown and disclosed in U.S. Pat. Nos. 3,964,382 and 4,357,633 show examples of engraving heads and stylus drivers of the type used in the past.

What is needed, therefore, is an engraving head which can move a diamond stylus into and out of a copper-plated surface of a gravure cylinder at a frequency rate greater than present engraving heads, thereby facilitating reducing the time required to engrave a gravure cylinder.

SUMMARY OF THE INVENTION

Thus, it is a primary object of this invention to provide an engraving head which can move a diamond stylus into and out of a cylinder surface of a gravure cylinder at a frequency which facilitates reducing the time required to engrave the cylinder.

Another object of the invention is to provide an engraving head having a magnetostrictive member that facilitates oscillating a stylus at frequencies in excess of 5 KHz or even 10 KHz.

Another object of the this invention is to provide an engraving head which utilizes a magnetostrictive member or actuator which can be compressed to achieve one of a plurality of strain curve characteristics.

Yet another object of the invention is to provide a method and apparatus which is relatively simple in design and fairly inexpensive to manufacture.

In one aspect of the invention, an engraver for engraving a gravure cylinder having an engraving surface is provided. The engraver includes an engraving bed, a headstock and a tailstock slidably mounted on the engraving bed where the headstock and tailstock cooperate to rotatably support the gravure cylinder at an engraving station of the engraver, and an engraving head mounted on the engraving bed at the engraving station to permit the engraving head to engrave the engraving surface. The engraving head includes a housing, an engraving stylus for engraving a cylinder positioned at an engraving station of the engraver, a magnetorestrictive member situated in the housing and operatively coupled to the engraving stylus, and an energizer for energizing the magnetostrictive member to cause the engraving stylus to oscillate to engrave a predetermined pattern of cells on a surface of the cylinder.

In another aspect of the invention, a stylus driver for driving a stylus in an engraver is provided. The stylus driver includes a magnetostrictive member coupled to the stylus, and an energizer for energizing the magnetostrictive member to cause the stylus to oscillate to engrave a predetermined pattern of cells on a surface of a cylinder positioned at an engraving station in the engraver.

In still another aspect of the invention, a method for engraving a predetermined pattern of cells in a cylinder rotatably mounted on an engraver is provided. The method includes the steps of coupling the stylus to a magnetostrictive member, positioning the stylus in proximate relationship with the cylinder, rotating the cylinder, and energizing the magnetostrictive member to oscillate the stylus to engrave the predetermined pattern of cells on the cylinder.

In still another aspect of the invention, an engraving head for use in an engraver is provided. The engraving head includes a housing, an engraving stylus for engraving a cylinder positioned at an engraving station of the engraver, a magnetostrictive member situated in the housing and operatively coupled to the engraving stylus, and an energizer for energizing the magnetostrictive member to cause the engraving stylus to oscillate to engrave a predetermined pattern of cells on a surface of the cylinder.

In still another aspect of the invention, a method for engraving a gravure cylinder is provided which includes the steps of rotatably mounting a gravure cylinder at an engraving station of an engraver, positioning a stylus in proximate relationship with an engraving surface of the gravure cylinder, coupling the stylus to a magnetostrictive member, and energizing the magnetostrictive member to oscillate the stylus during the rotation of the gravure cylinder to engrave the predetermined pattern of cells on a surface of the gravure cylinder.

These and other objects and advantages of the invention will be apparent from the following description, the accompanying drawings and the appended claims.

DETAILED DESCRIPTION OF THE PREFERRED EMBODIMENTS

Figure 1:
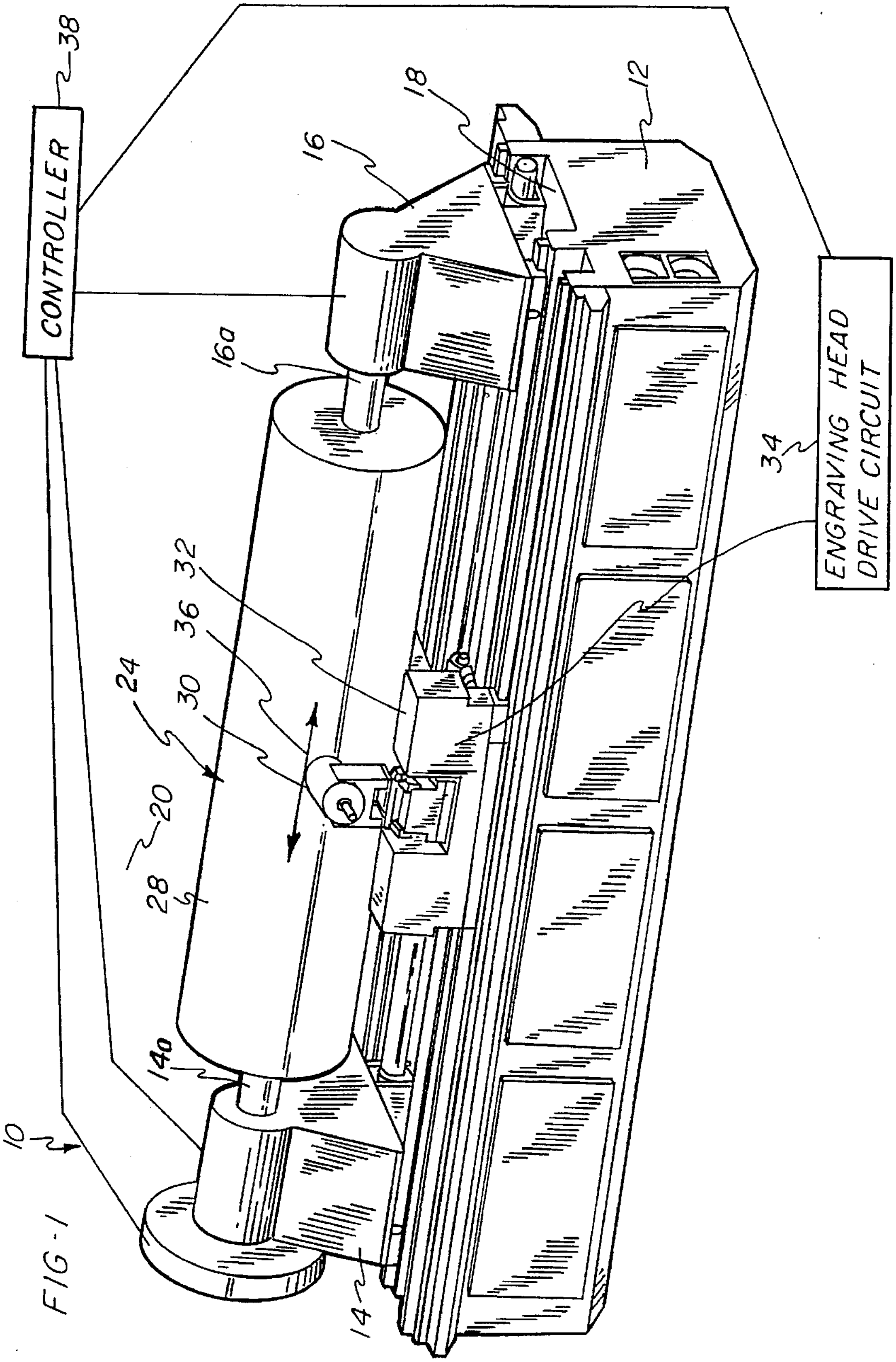
FIG. 1 is a perspective view of an exemplary gravure engraving machine in which the present invention may be used.
Figure 2:
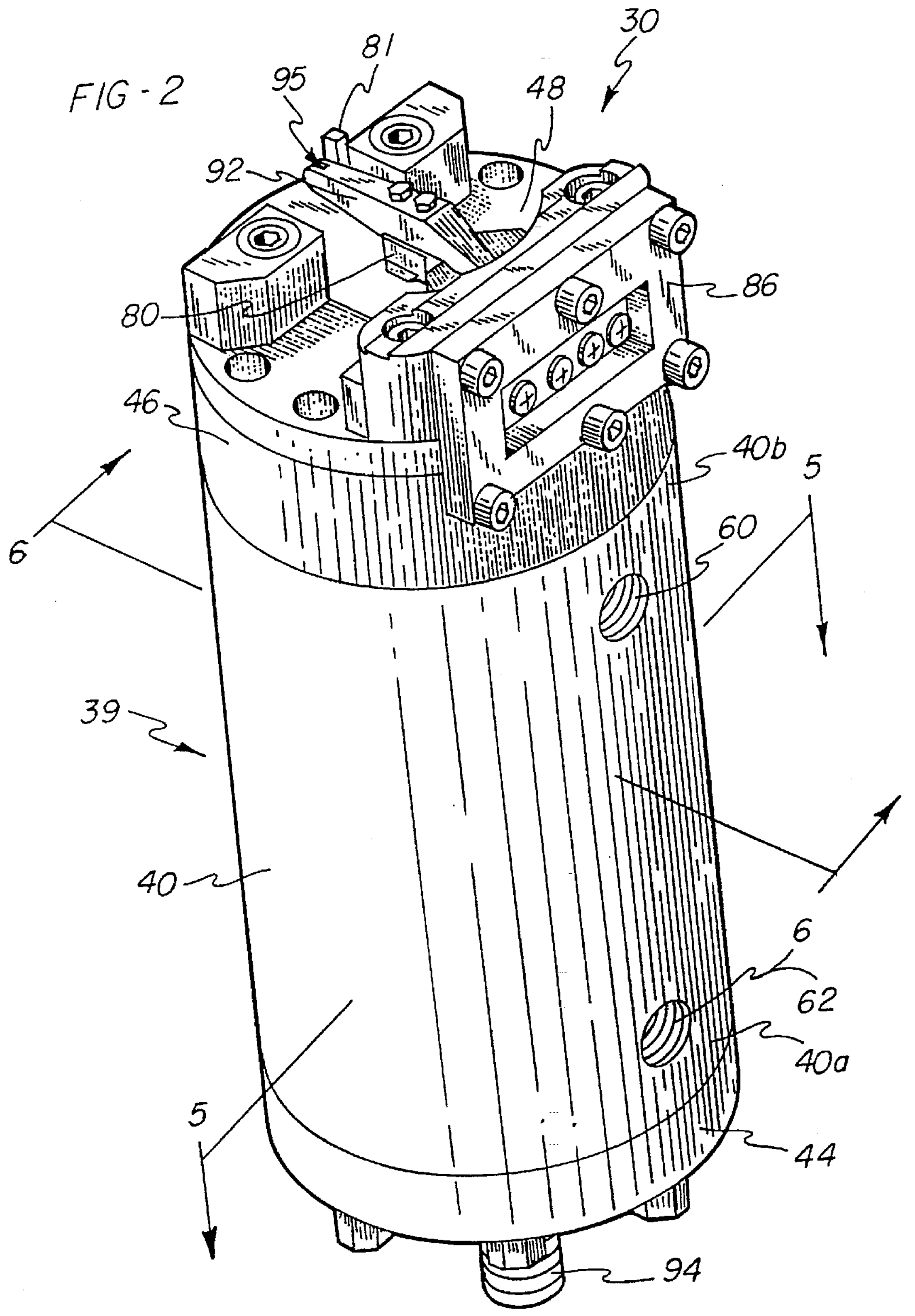
FIG. 2 is a perspective view of an engraving head of the present invention.

Referring now to FIG. 1, there is shown an exemplary engraving machine or engraver 10 such as a gravure engraver. The engraver 10 may have a surrounding slidable safety cabinet structure which is not shown for ease of illustration. Engraver 10 includes a frame or bed 12 having an engraving station comprising a slidably mounted headstock 14 and tailstock 16 which support a cylinder 24. The cylinder 24 can be of varying lengths and diameters. The headstock 14 and tailstock 16 include drivable support shafts 14*a* and 16*a*, respectively, which rotatably support the cylinder 24, and which couple the cylinder 24 to a cylinder drive motor (not shown).

Figure 6:
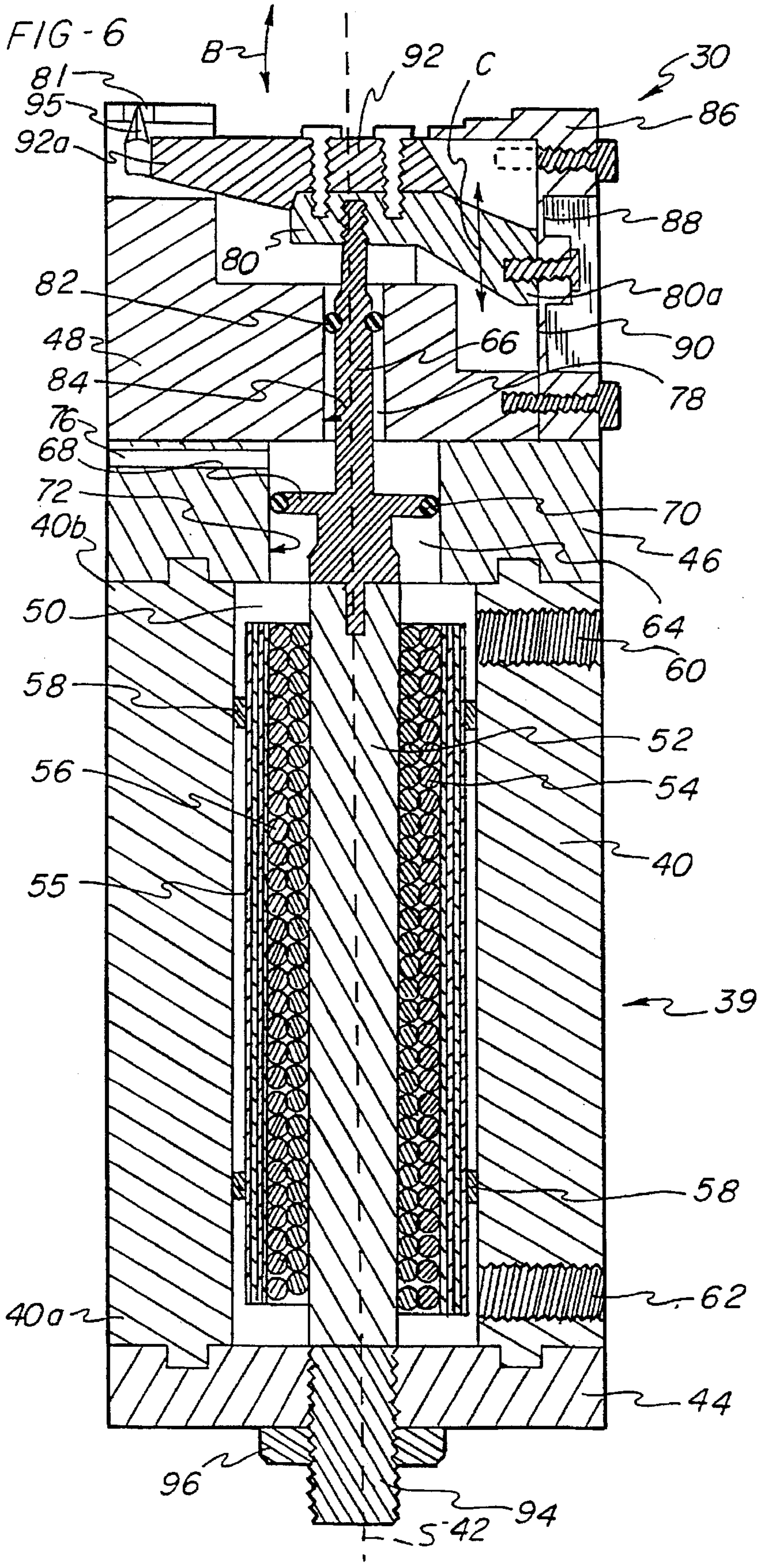
FIG. 6 is a longitudinal sectional view of the engraving head taken along the line 6—6 in FIG. 2.
Figure 7A:
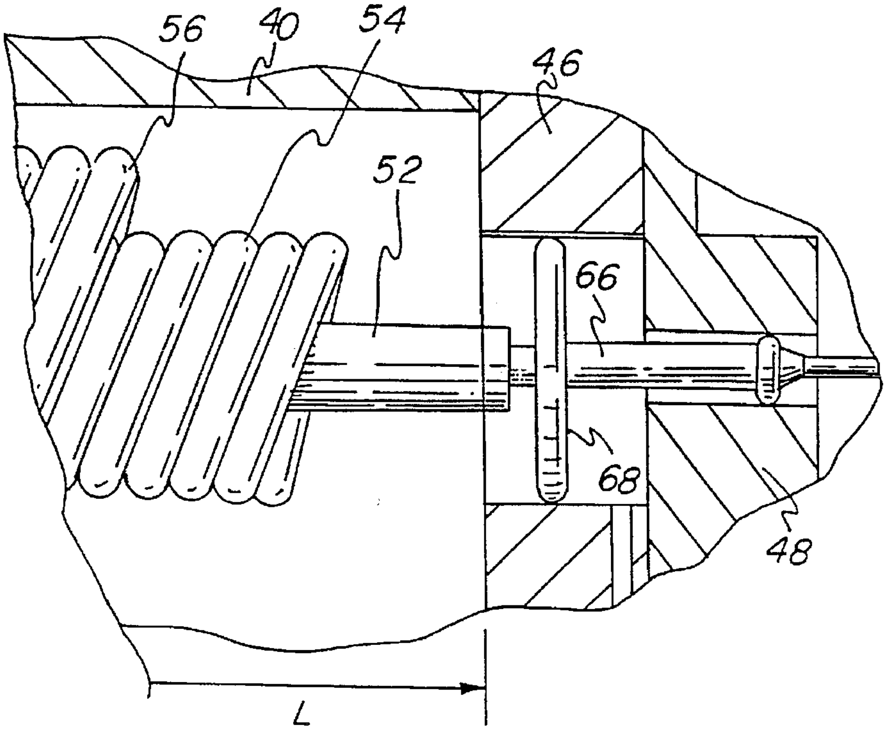
FIGS. 7*a*–7*e* are partially sectional cut-away views of the magnetostrictive actuator of the present invention operating under varying magnetic fields.
Figure 7B:
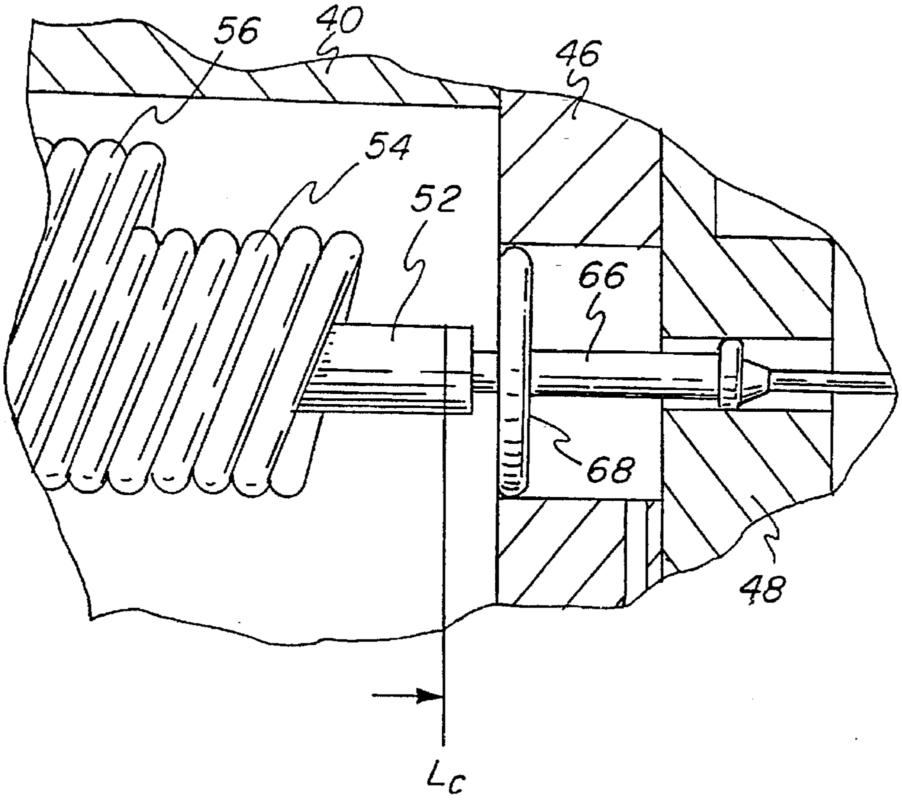
Figure 7C:
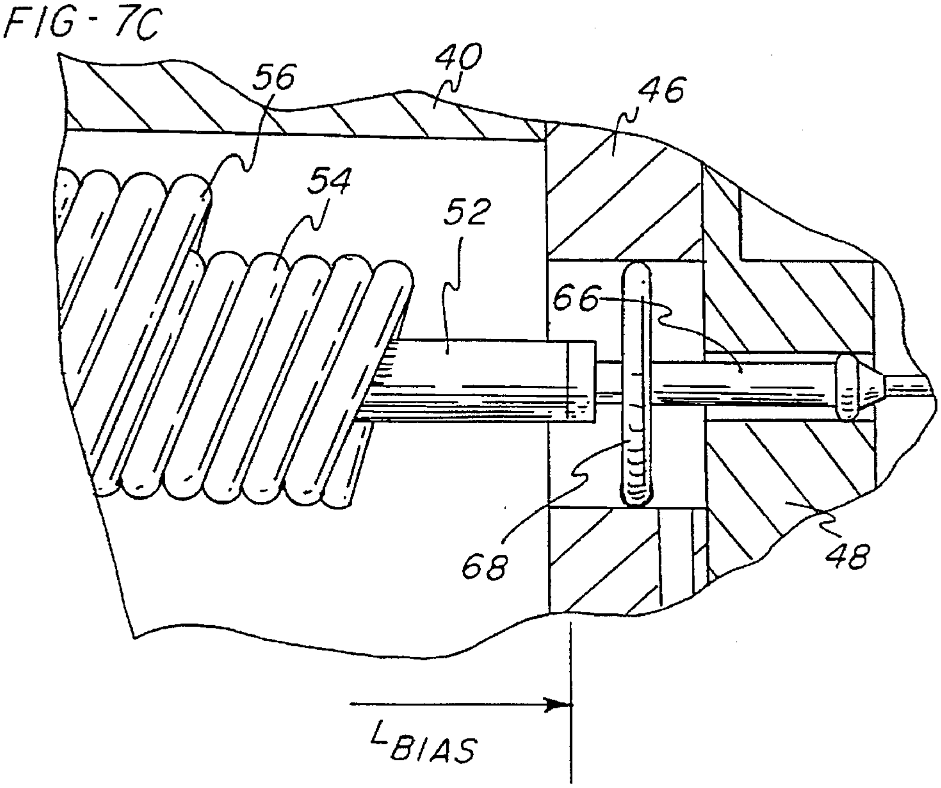
Figure 7D:
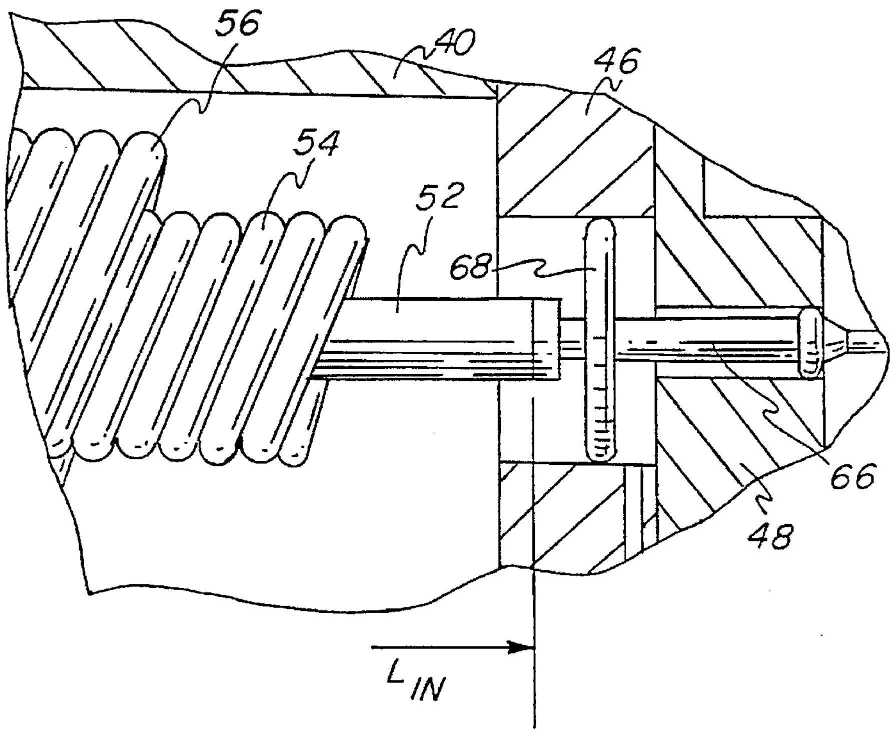
Figure 7E:
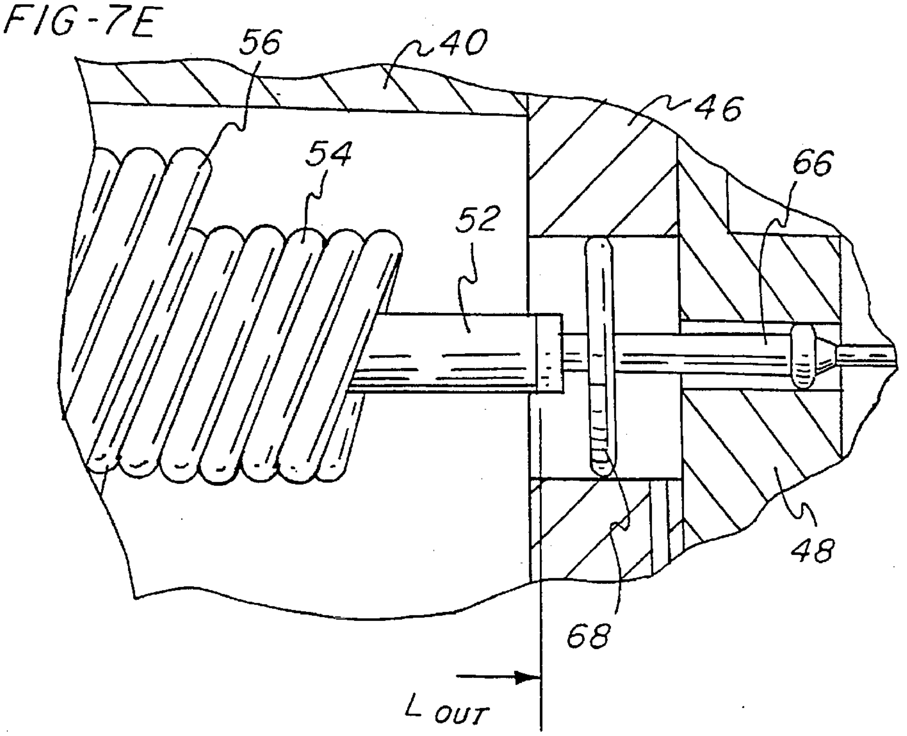

The cylinder 24 may be plastic or metal such as zinc and typically has a copper-coated engraving surface 28 which is engraved by an engraving head 30 having a cutting tool or stylus 95 (FIG. 3) to be discussed further below. The engraving head 30 is mounted on a carriage 32 (FIG. 1) such that an engraving head drive circuit 34 can cause the cutting tool or stylus 95 (FIG. 6) to move toward and away from the cylinder 24 in a direction which is generally radial with respect to the central axis of the cylinder 24. The carriage 32 is also slidably mounted on the frame 12 such that it can traverse the entire length of the cylinder 24 in the directions shown by the double arrow 36 in accordance with a lead screw/drive motor assembly (not shown).

A programmable controller 38 controls the operation of the engraver 10, and more particularly, the operation of the engraving head 30 and drive motors (not shown) for the headstock 14, tailstock 16, cylinder 24, and carriage 32. The engraving head drive circuit 34 can be integral with the controller 38, Or can be separate therefrom as shown in FIG. 1. An exemplary controller is disclosed in U.S. patent application Ser. No. 08/022,127 filed Feb. 25, 1993, U.S. Pat. No. 5,424,845 and assigned to the same Assignee of the present invention, and which is hereby incorporated by reference and made a part thereof.

Referring now to FIGS. 2–6, the engraving head 30 of the present invention is shown in more detail. The engraving head 30 includes a housing 39 having a longitudinal axis 42 (FIG. 6) and having a housing body 40, an end wall body 44 secured to an end 40*a* of the housing body 40, a compression cylinder body 46 secured to the other end 40*b* of the housing body 40, and a stylus arm body 48 secured to the compression cylinder body 46 remote from the housing body 40.

Figure 5:
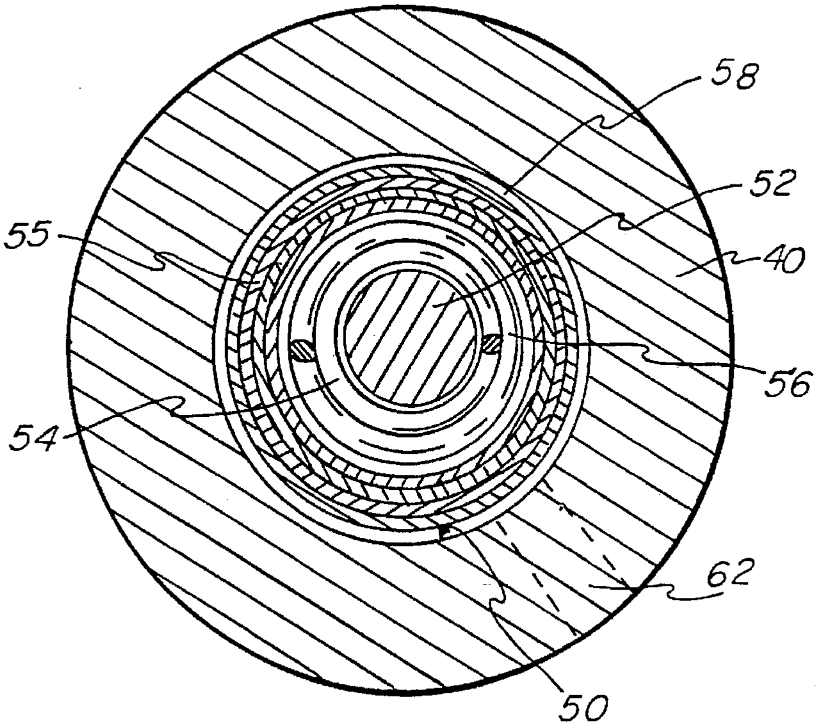
FIG. 5 is a cross-sectional view of the engraving head taken along the line 5—5 in FIG. 2.

With particular reference to FIG. 5, the housing body 40 comprises an internal passageway or cavity 50 having an actuator or magnetostrictive member 52 disposed therein. In the embodiment being described, the actuator 52 is generally centrally disposed and extends generally along the longitudinal axis 42 of the housing body 40. The actuator 52 is generally cylindrical and formed from a magneto-restrictive material having a coefficient of magnetostrictive expansion of at least 500 parts per million. One suitable magnetostrictive material is a magnetic anisotropy compensated alloy $Tb_xDy_{1-x}Fe_2$ known commercially as TERFENOL-D™ which includes the elements terbium (Tb), dysprosium (Dy) and iron (Fe). Terbium and dysprosium are both highly magnetostrictive lanthanides. TERFENOLD-D™ is available from Etrema Products, Inc., 306 South 16th Street, Ames, Iowa 50010.

In the embodiment described, the actuator 52 is formed from seven longitudinally extending generally elongate TERFENOL-D™ slices each having a thickness of about 0.070 inch which are laminated together to form a cylindrical rod having a diameter of about 0.5 inches and a length of about three inches, a cross-sectional view of which is shown in FIG. 5. The actuator 52 has a fundamental frequency of approximately 4 KHz and a third harmonic frequency of approximately 12 KHz. In the embodiment being described, the third harmonic is the operating frequency of the engraving head 30 as discussed further below. Preferably, the actuator 52 comprises a length of about six inches or less and a diameter of less than one inch. The actuator 52 could be formed to have different thicknesses, diameters, shapes and/or lengths which form different actuator 52 shapes (e.g. octagonal, hexagonal, rectangular, and the like) and dimensions.

Figure 8:
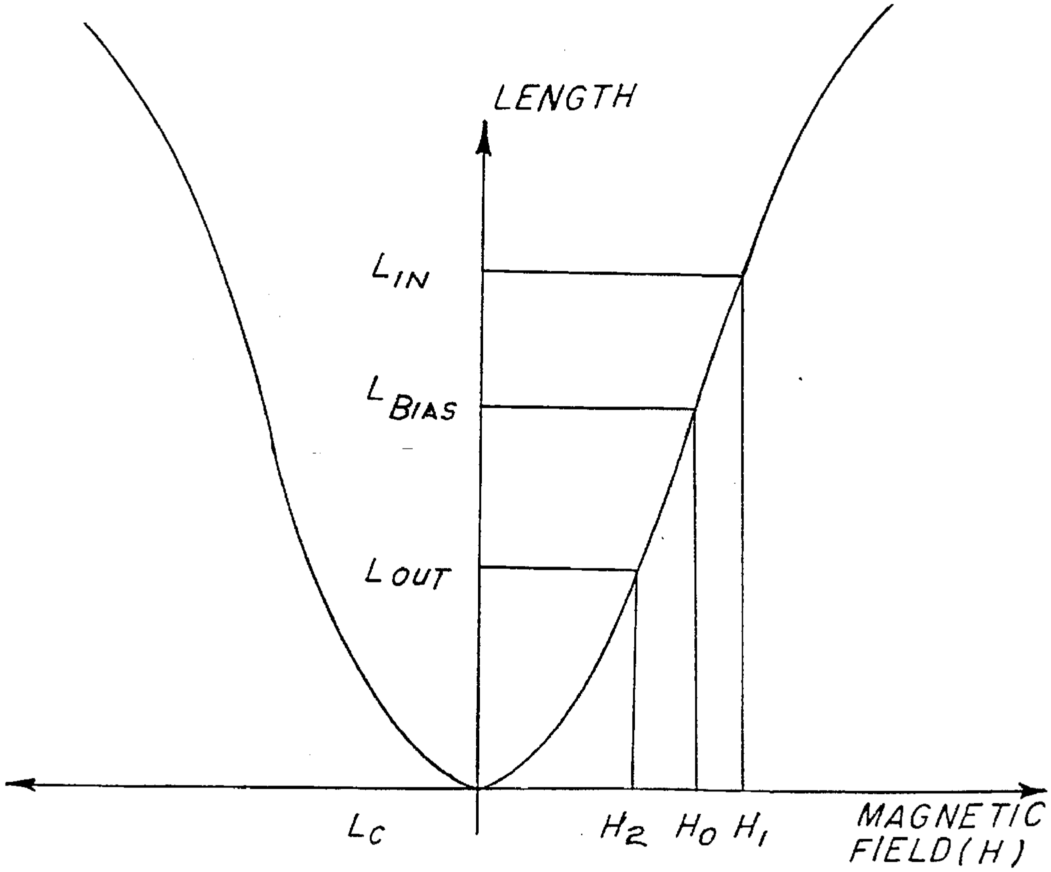
FIG. 8 is a graph showing length or strain vs. magnetic field intensity for the magnetostrictive actuator.

The magnetostrictive properties of the actuator 52 are such that when a magnetic field is applied thereto, small magnetic domains within the actuator 52 rotate to align with the applied magnetic field which causes internal strains within the actuator 52. The internal strains result in an expansion of approximately 0.001 inch per inch of actuator 52 in the direction of the applied magnetic field. As shown by the length or strain vs. magnetic field intensity curve of FIG. 8. The strain S is equal to $\Delta L/L$ where L is the length of the actuator, and magnetic field intensity H is equal to nI where I is the current through a surrounding coil of N turns over a coil length $L_c$ with $n=N/L_c$. Notice that if the applied magnetic field is reversed, the internal magnetic domains reverse direction but again align along the magnetic field direction and also result in an increase in length of the actuator 52, as represented by the curve in FIG. 8. As the current is increased in either direction, the magnetic field intensity increases and the length of the actuator 52 increases to a saturation point where no further elongation of the actuator 52 is achieved because the internal magnetic domains are essentially lined up with the surrounding magnetic field.

A longitudinally extending drive coil 54 (FIG. 3) is operatively positioned around the actuator 52 as shown. A longitudinally extending bias coil 56 is positioned around and spaced radially outwardly from the drive coil 54. The drive coil 54 and bias coil 56 cooperate to operate as an energizer for energizing the actuator 52, but it should be appreciated that a single coil may be used to energize the magnetostrictive member 52 if desired. The bias coil 56 is used to establish a DC biasing field $H_0$ (FIG. 8) about the actuator 52 which biases the actuator 52 from a compressed length $L_c$ (as shown in FIGS. 6*b* and 7) to a biased operating length $L_{bias}$ (as shown in FIGS. 6*b* and 7). In the embodiment being described, the length $L_{bias}$ is approximately one-half the total possible linear expansion limit of the actuator 52. Alternatively, the DC biasing field $H_0$ could be established with a permanent magnet (not shown) which replaces the bias coil 56.

After the actuator 52 is biased to the operating length $L_{bias}$ by the bias coil 56, a composite drive signal 116, as discussed further below, is applied to the drive coil 54 to modulate the magnetic field intensity established by the bias coil 56. In this regard, when a positive current flows through the drive coil 54, the magnetic field created by the current flow adds to the DC biasing field creating a resulting magnetic field $H_1$ which causes the additional expansion of the actuator 52 from the length $L_{bias}$ to the length $L_{in}$ (as shown in FIGS. 6c and 7). When a negative current flows through the drive coil 54, the magnetic field created by the negative going current cancels the DC biasing field creating a resulting magnetic field $H_2$ which causes the actuator 52 to contract from the length $L_{bias}$ or $L_{in}$ to a length $L_{out}$ for a net actuator 52 expansion of $L_{out}$ (as shown in FIGS. 6d and 7). Thus, an axially oriented oscillation is established about the length $L_{bias}$ with an operating range of $L_{in}$ to $L_{out}$.

In the embodiment being described, about 7.0 amperes of current flows through an approximately 300-turn bias coil 56 to provide about 2100 AT (ampere-turns) for generating the DC biasing field which causes a the actuator 52 to initially expand approximately 50 microns to reach the operating length $L_{bias}$. The composite drive signal 116 then causes the actuator 52 to alternatively expand and contract about 25 microns from the operating length $L_{bias}$ to the reach the lengths $L_{in}$ and $L_{out}$, respectively, for a net operating range of about 50 microns.

A plurality of longitudinally extending steel laminations 55 (FIG. 6) overlap the bias coil 56. The laminations 55 facilitate reducing the flow of eddy currents in the steel housing body 40 and provide a return path for the magnetic lines of flux that are generated when current flows through the drive and bias coils 54, 56. A pair of longitudinally spaced-apart retainer rings 58 are interposed between the steel laminations 55 and a radially inner surface of the housing body 40.

A coolant inlet 60 and a coolant outlet 62 extending through the housing body 40 permit a liquid coolant to be pumped through the cavity 50. More particularly, the liquid coolant flows between the actuator 52 and drive coil 54, and the drive coil 54 and bias coil 56 to reduce the heat generated as a result of hysteresis and eddy currents in the actuator 52 during operation. The retainer rings 58 prevent the coolant from passing between the housing body 40 and the bias coil 56 where minimal heat dissipation is required. The coolant is preferably a silicon-based coolant having non-conductive properties.

The present invention also comprises compression means or a compressor for axially compressing the actuator 52. In this regard, the compression cylinder body 46 is secured to the housing body 40 by conventional means such as threaded screws, bolts, or the like. The compression cylinder body 46 includes a central chamber or cavity 64 which communicates with the cavity 50. A longitudinally extending piston rod or shaft 66 is centrally disposed and is generally coaxial with actuator 52 such that it can axially drive the actuator 52. The piston rod 66 has a piston 68 formed integral therewith and disposed for axial movement within the central cavity 64. An annular seal or O-ring 70 extends circumferentially about the piston 68 and elastically contacts a radially inner wall 72 defining the cavity 64. A second annular seal or O-ring 82 extends circumferentially about the piston rod 66 and elastically contacts an inner wall 84 defining a central bore 78 to effectively seal a pressurized chamber 74 defined by the piston 68 and the inner wall 72. A pressure inlet/outlet port 76 extends through the compression cylinder body 46 to provide a quantity of pressurized hydraulic or preferably pneumatic medium to the chamber 74 from a supply source (not shown).

Notice that a stylus arm body 48 is secured to the compression cylinder body 46 by conventional means such as threaded screws, bolts, or the like. The piston rod 66 passes longitudinally through the central bore 78 and threadably engages a cantilevered arm 80 extending transverse to the piston rod 66.

When the chamber 74 is pressurized, the piston 68 exerts and maintains a compressive force against the actuator 52. This facilitates preventing the actuator 52 from operating in tension, and it also enables a user to select an optimum or desired operational curve for the actuator 52 as described below. With regard to undesirable tension, moderate tensile forces can cause the actuator 52 to fracture at nodal points along the length of the actuator 52. To facilitate avoiding the possibility of fracturing, the actuator 52 is maintained in compression by applying approximately 500 psi of a regulated pneumatic medium such as air to the chamber 74. This, in turn, causes the piston 68 to apply approximately 375 pounds of compressive force to the actuator 52 (assuming a piston area of approximately 0.75 $inch^2$). The actuator 52 contracts from a non-biased quiescent length L (as shown in FIG. 6a) to the compressed length $L_c$ (as shown in FIGS. 6b and 7) with the compressive force applied thereto.

Figure 9:
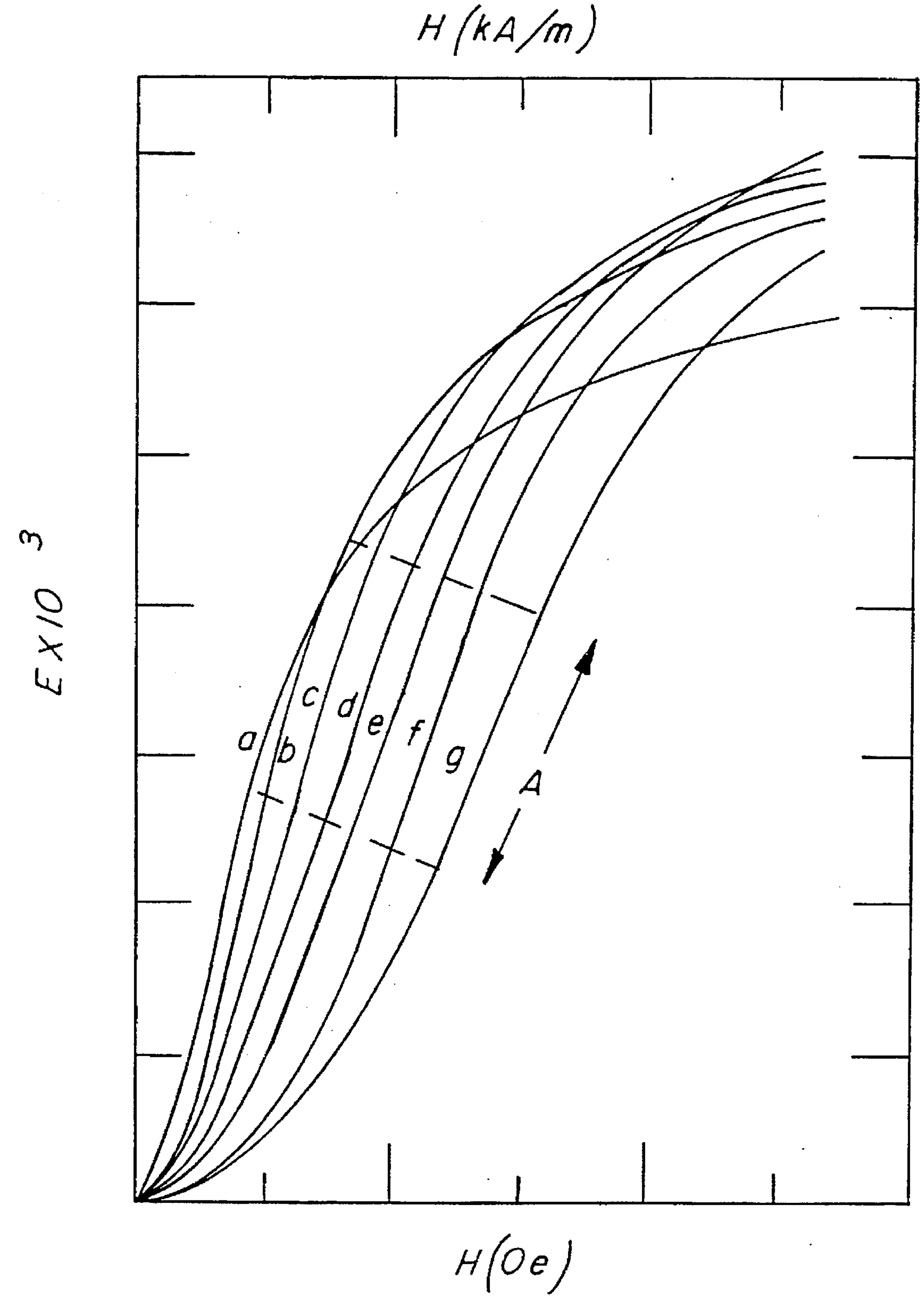
FIG. 9 is a graph showing a family or plurality of length or strain vs. magnetic field intensity curves for various compression levels of the magnetostrictive actuator.

With regard to selecting an optimum or desired operational curve for actuator 52, a family or plurality of length or strain vs. magnetic field intensity operational curves for the actuator 52 under various levels of compression is shown in FIG. 9. Curve (g) represents operational characteristics when a particular compressive force is applied to the actuator 52. Curve (a) represents operational characteristics of the actuator 52 when a smaller compressive force is applied to the actuator 52. Notice that as the compressive force increases from curve (a) to curve (g), the operating range (such as indicated by double arrow A in FIG. 9) becomes fairly linear. This permits a desired or optimum operating curve to be selected which exhibits a desired linear operating range for modulating the actuator 52 as discussed above.

Figure 3:
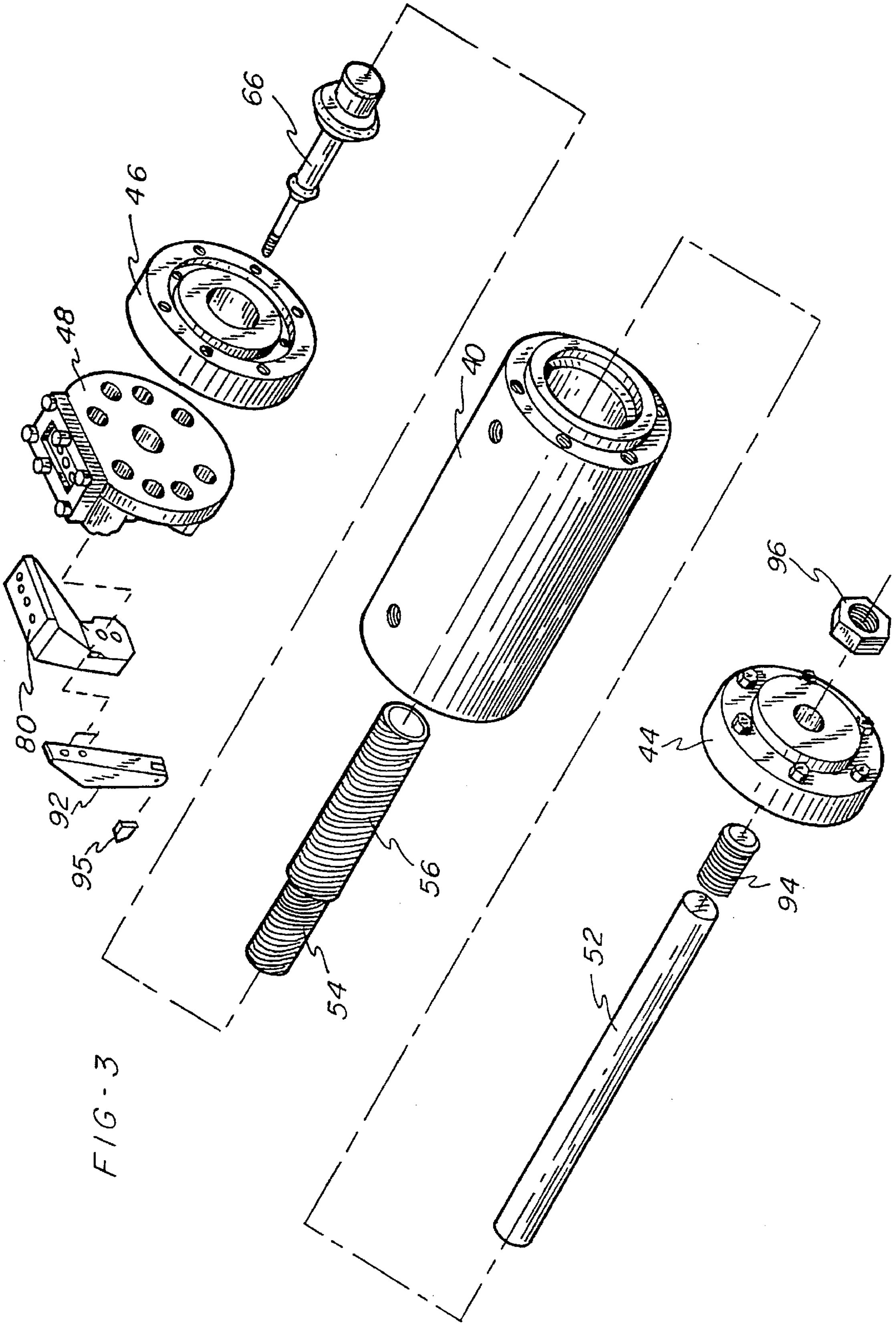
FIG. 3 is an exploded view showing features of the engraving head.
Figure 4:
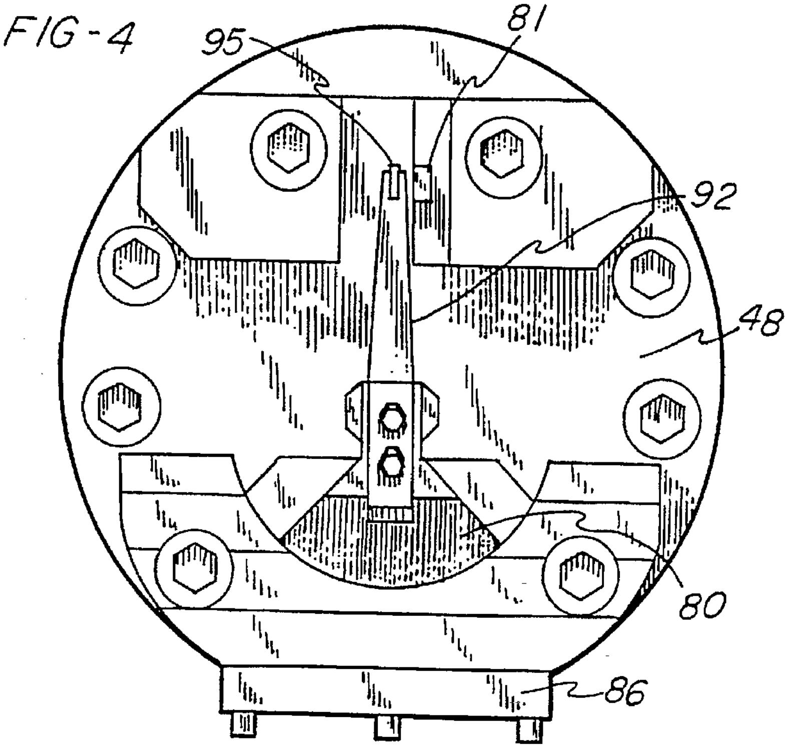
FIG. 4 is an end view of the engraving head shown in FIG. 2.

In the embodiment being described, an amplifier or amplification means for amplifying the expansion of the actuator 52 may be utilized. One suitable amplifier may comprise the cantilevered or amplifier arm 80 which has one end thereof 80a rigidly secured to a backing plate 86 which is oriented in a plane extending generally tangential to the axis 42 (FIG. 3). The backing plate 86 includes first and second flexible spring plate bodies 88 and 90, respectively, which extend parallel to the longitudinal axis 42. The spring plate bodies 88 and 90 flex to permit the cantilevered arm 80 to pivot in the direction of double arrow B in FIG. 6 about the backing plate 86 while preventing relative movement or "backlash" between the backing plate 86 and the end 80a of the cantilevered arm 80. That is, the backing plate 86 and the end 80a of the cantilevered arm 80 form a rigid bearing having no movement or play in the direction of double arrow C in FIG. 6.

A stylus arm 92 is secured to the cantilevered arm 80 by conventional securing means. The diamond cutting or engraving stylus 95 is supported at a pivoting end 92a of the stylus arm 92. Although not shown, the stylus arm 92 may include a plurality of apertures or holes therethrough which reduce the weight of the stylus arm 92. The apertures will help raise the resonant frequency of the stylus arm 92 above the operating frequency of the engraving head 30 to prevent interference during operation. Also, the cantilevered arm 80 and stylus arm 92 may be combined into an integral onepiece construction which is pivotally secured to the backing plate 86 and which supports the cutting stylus 95 in the same or similar manner. A guide shoe 81 is mounted on the stylus arm body 48 in a precisely known position relative to the oscillating stylus 95. When the guide shoe 81 contacts the cylinder 24, the stylus 95 oscillates from an engraving position just barely touching the cylinder 24 to a retracted position away from the cylinder 24 as discussed above.

It should be appreciated that the piston rod 66, cantilevered arm 80 and stylus arm 92 cooperate to form a mechanical amplifier which provides an amplification ratio or gain of approximately either 2:1 or 3:1. Thus, if the actuator 52 has an operating range between $L_1$ and $L_2$ of 20 microns, then the mechanical amplifier provides a 60 micron displacement of the diamond stylus 95 toward and into the copper-plated surface 28 of the cylinder 24 to effect engraving of one or more cells as discussed further below.

Alternatively, amplification may be performed by other means. For example, the amplifier or amplification means could comprise a hydraulic or pneumatic amplifier which includes a housing having two spaced-apart diaphragms (not shown) defining a hydraulic fluid filled reservoir or bladder therebetween. The amount of amplification derived from the amplifier is related to a difference ratio between the diaphragm diameters. To achieve amplification, a larger diameter diaphragm could abut against the actuator 52 or a compression means interposed between the diaphragm and actuator 52, and a smaller diameter diaphragm could directly drive the stylus 95 or could abut against the stylus arm 92. In operation, a small axial movement of actuator 52 against the larger diameter diaphragm causes a greater axial movement of the smaller diaphragm and thus an amplified axial movement of the stylus.

Note that an end wall body 44 is secured to the housing body 40 by conventional means such as threaded screws, bolts, or the like. An adjustment screw 94 extends through a central threaded bore in the end wall body 44 and coaxially abuts against the actuator 52. The end wall body 44 and adjustment screw 94 serve as a rigid body to anchor an end of the actuator 52 during operation. Further, the screw 94 can be used to adjust the axial position of the actuator 52 and more particularly the radial distance separating the diamond stylus 95 from the cylinder 24 when the engraving head 30 is mounted on the carriage 32. A lock-nut 96 secures the adjustment screw 94 to the end wall body 44.

Figure 10:
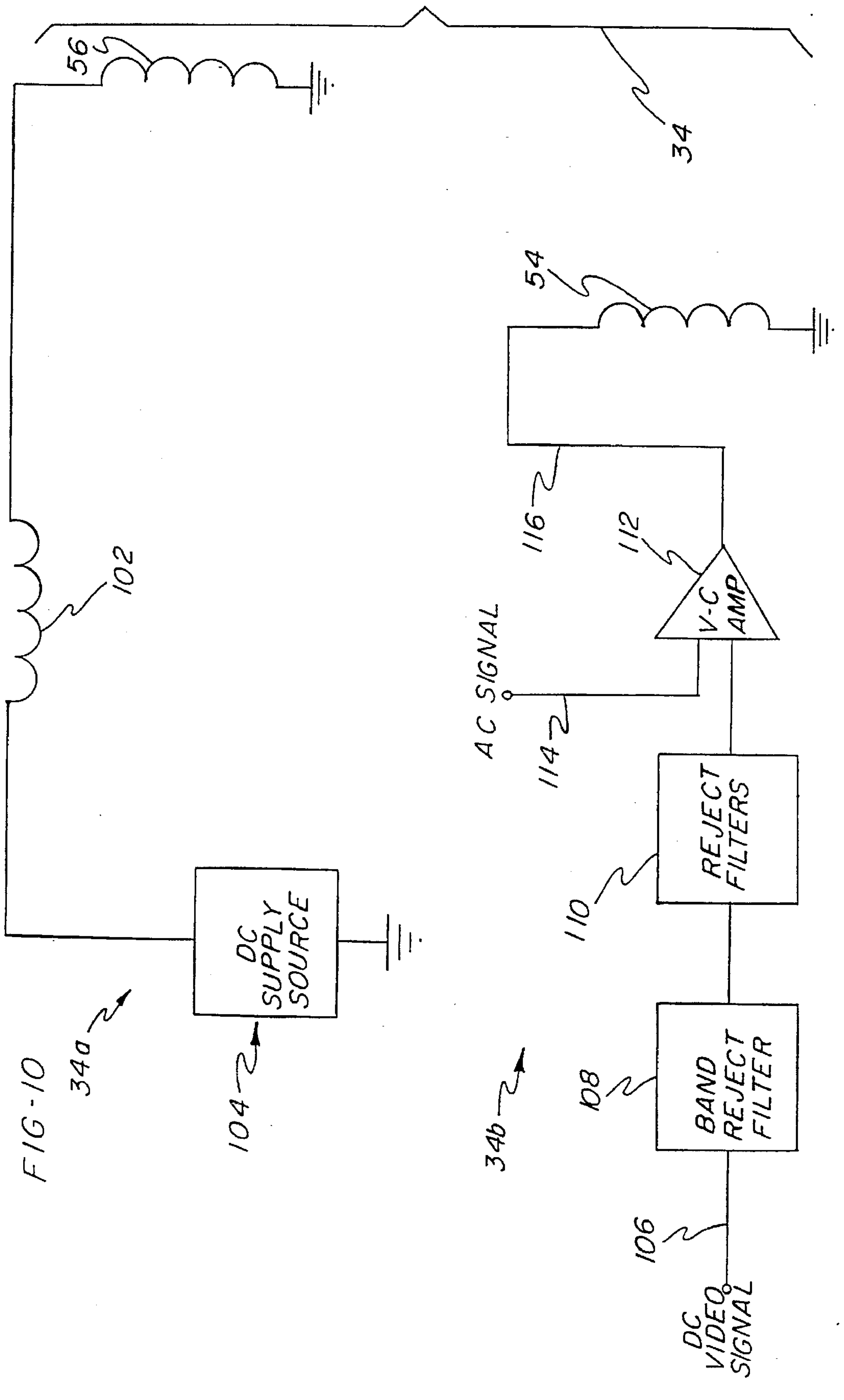
FIG. 10 is a block diagram of an exemplary engraving head driver circuit.

FIG. 10 illustrates a block diagram of the engraving head drive circuit 34 shown in FIG. 1. The circuit 34 comprises a bias coil circuit **34*a* and a drive coil circuit 34*b*. With reference to the bias coil circuit 34*a*, a large inductor 102 is placed in series with a DC supply source 104 and the bias coil 56 to counter the effects of transformer action between the drive coil 54 and bias coil 56. Transformer action could detrimentally induce currents into the bias coil circuit 34*a* to nullify the drive circuit 34*b* if not nullified. Further, the drive coil 54 is positioned within the bias coil 56 and is made smaller than the bias coil 56 to thereby minimize the inductance characteristics of the drive coil 54**.

With reference to the drive coil circuit **34*b*, a DC video or imaging signal 106 representing the image to be engraved into the cylinder 24 is applied to one or more band reject filters 108 and 110. The band reject filters 108, 110 reject the fundamental and/or other higher frequencies that the actuator 52 may introduce into the various engraving head components (i.e. the housing body 40, end wall body 44, compression cylinder body 46 and stylus arm body 48, piston rod 66, cantilevered arm 80, stylus arm 92, etc.) which oscillate in response to the actuator 52 operating at the third harmonic frequency of the actuator 52**. U.S. Pat. No. 4,450,486 discloses techniques for damping the engraving head components which oscillate in response to an actuator and which is incorporated by reference and made a part hereof.

After being conditioned by the filters 108 and 110, the DC video signal is applied to a voltage-to-current amplifier 112 and summed with a constant frequency AC input signal 114 to produce a composite drive signal 116 having both AC and DC components. The AC input signal 114 and DC video signal 106 are produced within a circuit (not shown) in the controller 38.

In operation, the controller 38 directs the engraving head 30 to urge the diamond-tipped stylus arm 92 into contact with the cylinder 24 to engrave a predetermined pattern or series of controlled-depth cells arranged in a circumferential track (not shown) on the copper-plated surface 28 thereof. The linear movement of the carriage 32 produces a series of axially-spaced circular tracks containing cells which represent the image to be engraved.

The AC component 114 of the drive signal 116 causes the stylus arm 92, and more particularly the stylus 95 to oscillate in a sinusoidal manner relative to the cylinder 24 at an operating frequency of between approximately 10 to 15 KHz. The rotational speed of the cylinder drive motor 26 is adjusted so as to produce an engraving track having an odd number of wavelengths during each complete rotation of the cylinder 24.

Figure 11:
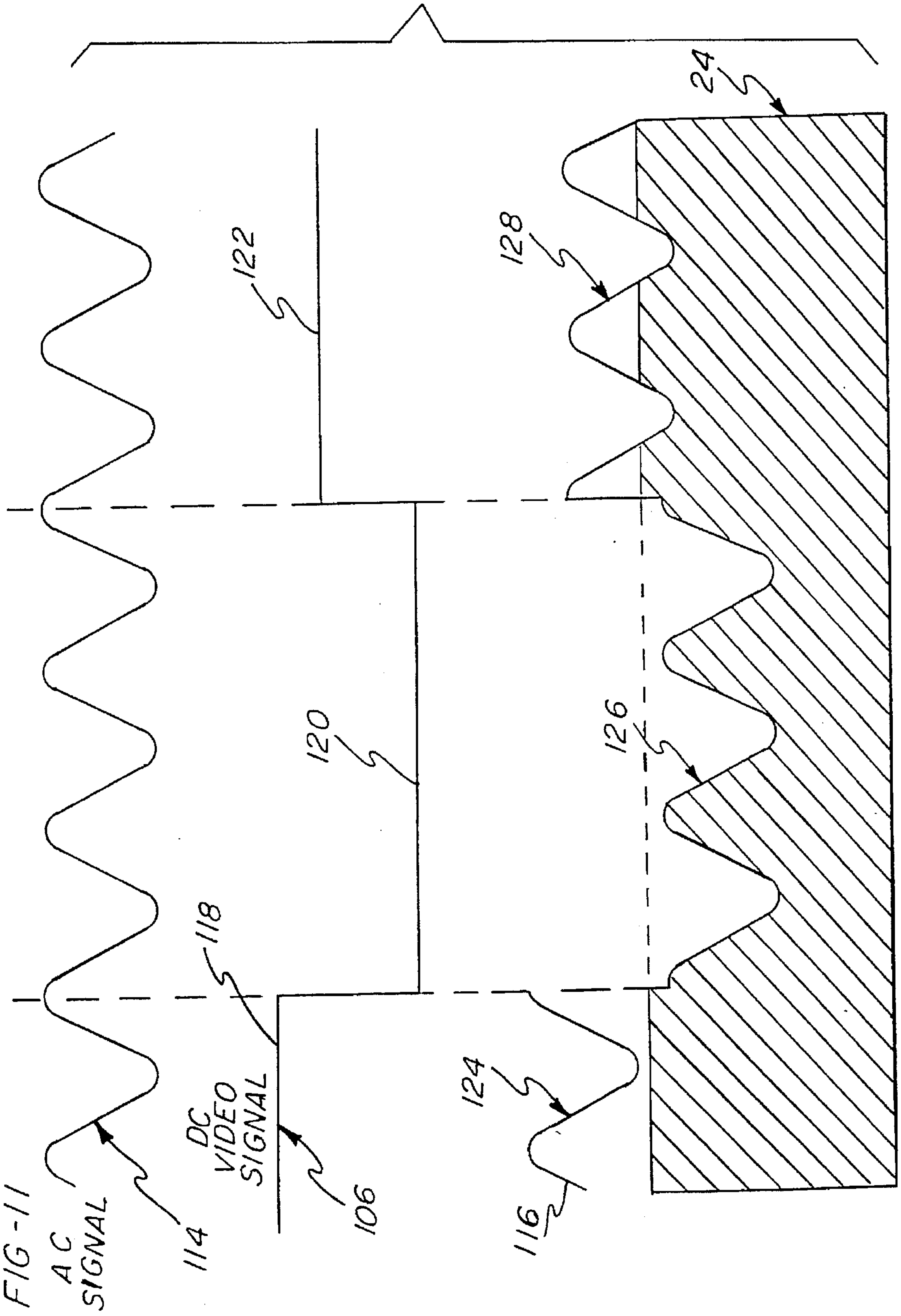
FIG. 11 is a schematic illustration of an AC component signal, a DC component signal and a drive signal for energizing the magnetostrictive member.

With reference to FIG. 11, the DC video component 106 of the composite drive signal 116 utilizes a plurality of discrete DC voltage levels to signal the action to be taken by the stylus 95. For instance, the DC video component 106 includes a white video level 118, a black video level 120 and a highlight video level 122. When the white video level 118 is present in the composite drive signal 116, the actuator 52 contracts to the length Lou™ and the diamond stylus 95 is raised out of contact with the cylinder surface 28 as shown by the stylus position 124.

When the DC video component 106 goes from the white video level 118 to the black video level 120, the actuator 52 elongates to a length $L_{in}$ and the diamond stylus 95 moves into engraving contact with the cylinder surface 28 as shown by the stylus position 126. When the DC video component shifts to the highlight video level 122, the actuator elongates to a length somewhere between $L_{in}$ and $L_{out}$ and the diamond stylus 95 oscillates in and out of engraving contact with the cylinder 24 as shown by the stylus position 128. This oscillation in turn causes the engraver 10 to engrave the predetermined pattern.

While the forms of the device herein described constitute the preferred embodiments of the invention, it is to be understood that the invention is not limited to these precise forms of device, and that changes may be make therein without departing from the scope of the invention which is defined in the appended claims.

For instance, instead of introducing the bias current through the separate bias coil 56, the bias current may be introduced by means of a magnet, or by applying DC bias current to the drive coil 54 through a series inductor placed in parallel with the composite drive signal 116 which is applied to the drive coil 54 through a series capacitor. One coil can be used to carry the bias current, the AC current and the video imaging signal current from a single circuit.

Also, a bellville washer may be utilized to provide linear compression of the actuator 52 in place of the pneumatic or hydraulic compression cylinder body 46.

Further, in order to increase the resonant frequency of the engraving head housing 39 above the operating frequency of the actuator 52, the rigidity of the housing 39 can be increased by welding or otherwise firmly securing together the housing body 40, end wall body 44, compression cylinder body 46 and stylus arm body 48 rather than using conventional securing means such as the above-mentioned threaded screws, bolts, or the like. Also, the resonant frequency can be increased by forming a unitary housing incorporating therein the some or all of the bodies 40, 44, 46 and 48.

For certain types of engraving operations, there is sufficient elongation of the actuator 52 to drive the stylus 95 directly from the actuator without the use of an amplifier. Thus, the stylus 95 could be positioned substantially in-line with the actuator 52.

Further, the actuator 52 could work against a largely rigid or fixed mass instead of working against the housing 39 and particularly the end wall body 44.

What is claimed is:

1. An engraving device for engraving a workpiece comprising:

an actuator; and an engraving stylus for engraving the workpiece;

an energizer coupled to said actuator for energizing said actuator within a substantially linear range of operation and for causing said engraving stylus to oscillate to engrave a predetermined pattern on a surface of the workpiece, wherein said actuator comprises a magnetostrictive member for oscillating said engraving stylus in the linear range at frequencies in excess of 5 Khz.

2. The engraving device as recited in claim 1 wherein said magnetostrictive member comprises a coefficient of expansion of at least 500 parts per million.

3. The engraving device as recited in claim 1 wherein said magnetostrictive member comprises $Tb_xDy_{1-x}Fe_2$.

4. An engraving device for engraving a workpiece comprising:

an actuator having a line of actuation;

an engraving stylus for engraving the workpiece; and an energizer coupled to said actuator for causing said engraving stylus to oscillate to engrave a predetermined pattern on a surface of the workpiece, wherein said actuator comprises a magnetostrictive member having a plurality of harmonic frequencies, said energizer energizing said actuator such that said actuator operates on at least its third harmonic frequency.

5. The engraving device as recited in claim 4 wherein said magnetostrictive member comprises a coefficient of expansion of at least 500 parts per million.

6. The engraving device as recited in claim 4 wherein said magnetostrictive member comprises $Tb_xDy_{1-x}Fe_2$.

7. An engraving device for engraving a workpiece comprising:

an actuator having a line of actuation; an engraving stylus for engraving the workpiece; and an energizer for causing said engraving stylus to magnetostrictively oscillate in a substantially linear range to engrave a predetermined pattern on a surface of the workpiece, wherein said actuator is generally cylindrical and said stylus is integrally coupled to an end thereof.

8. The engraving device as recited in claim 7 wherein said energizer energizes said actuator to oscillate on at least a third harmonic frequency and at a frequency of at least 4 Khz.

9. A stylus driver for driving a stylus in an engraver comprising:

an actuator coupled to the stylus;

a driver for driving the actuator to cause said stylus to oscillate to engrave a predetermined pattern on a surface of a workpiece positioned at an engraving station in the engraver, wherein said stylus is situated on an arm having a resonant frequency; said resonant frequency being in excess of a frequency at which said driver oscillates said stylus.

10. The stylus driver as recited in claim 9 wherein said actuator is generally cylindrical in cross section and comprises a length of less than six inches and a diameter of less than one inch.

11. The stylus driver as recited in claim 9 wherein said actuator comprises an axis, said stylus being mounted to said actuator such that it is substantially coaxial.

12. The stylus driver as recited in claim 9 wherein said actuator comprises a magnetostrictive member situated in a housing and said arm is pivotally coupled to said housing.

13. The stylus driver as recited in claim 12 wherein said arm is rigid.

14. The stylus driver as recited in claim 13 wherein said driver drives said actuator on at least a third harmonic frequency of said actuator.

15. A stylus driver for driving a stylus in an engraver comprising:

an actuator coupled directly to the stylus;

a driver for driving the actuator to cause said stylus to oscillate to engrave a predetermined pattern on a surface of a workpiece positioned at an engraving station in the engraver;

wherein said actuator comprises a magnetostrictive member having a plurality of strain curves, said stylus driver further comprising:

a compressor for compressing said magnetostrictive member to achieve at least one of said plurality of strain curves.

16. The stylus driver as recited in claim 15 wherein said magnetostrictive member comprises a coefficient of magnetostrictive expansion of at least 500 parts per million.

17. The stylus driver as recited in claim 15 wherein said magnetostrictive member comprises $Tb_xDy_{1-x}Fe_2$.

18. The stylus driver as recited in claim 15 wherein said compressor comprises at least one shaft coupled to an end of said actuator for axially compressing said actuator.

19. The stylus driver as recited in claim 18 wherein said shaft comprises a piston secured thereto.

20. A method for engraving a predetermined pattern in a cylinder rotatably mounted on an engraver comprising the steps of:

coupling a stylus to an actuator;

said actuator comprising a magnetostrictive member; and magnetostrictively displacing said stylus in a substantially linear operating range such that it oscillates to engrave the predetermined pattern of cells on the cylinder.

21. The method as recited in claim 20 wherein said actuator comprises a plurality of strain curves, said method further comprising the step of:

compressing said actuator to achieve one of said plurality of strain curves.

22. The method as recited in claim 20 wherein said actuator comprises a magnetostrictive member, said method further comprising the step of:

biasing said magnetostrictive member to a biased condition.

23. The method as recited in claim 22 further comprising the steps of:

biasing said magnetostrictive member using a first coil;

energizing said magnetostrictive member with a second coil to oscillate the stylus while in the biased condition.

24. The method as recited in claim 23 wherein said magnetostrictive member comprises $Tb_xDy_{1-x}Fe_2$.

25. The method as recited in claim 20 wherein said actuator is generally cylindrical in cross section and comprises a length of less than six inches and a diameter of less than one inch;

said energizing step further comprising the step of:

energizing said magnetostrictive member such that it operates on at least its third harmonic.

26. The method as recited in claim 20, further comprising the steps of:

mounting said stylus to a rigid arm;

energizing said magnetostrictive member at a frequency which is less than a resonant frequency of said rigid arm.

27. The method as recited in claim 20, further comprising:

energizing said magnetostrictive member to operate on at least a third harmonic at a frequency of a least 4 Khz.

28. A method for engraving a cylinder comprising:

rotatably mounting a gravure cylinder at an engraving station of an engraver;

providing an engraving device comprising an actuator having a stylus;

energizing said engraving device to oscillate the stylus during rotation of the cylinder in order to engrave a predetermined pattern of engraved areas on a surface of the cylinder, wherein said actuator comprises a plurality of strain curves, said method further comprising the step of:

compressing said actuator to achieve one of said plurality of strain curves.

29. The method as recited in claim 28, further comprising the step of actuating a piston to compress said actuator.

30. A method for engraving a cylinder comprising:

rotatably mounting a gravure cylinder at an engraving station of an engraver;

providing an engraving device comprising an actuator having a stylus;

energizing said engraving device to oscillate the stylus during rotation of the cylinder in order to engrave a predetermined pattern of engraved areas on a surface of the cylinder, wherein said actuator comprises a magnetostrictive member, said method further comprising the step of:

biasing said magnetostrictive member to a biased condition.

31. The method as recited in claim 30 wherein said actuator comprises the step of:

energizing said magnetostrictive member to oscillate the stylus while in the biased condition.

32. The method as recited in claim 30 wherein said magnetostrictive member comprises $Tb_xDy_{1-x}Fe_2$.

33. The method as recited in claim 30 wherein said actuator is generally cylindrical and said stylus is integrally coupled to an end thereof.

34. The method as recited in claim 30 wherein said actuator is generally cylindrical in cross section and comprises a length of less than six inches and a diameter of less than one inch.

35. The method as recited in claim 30, further comprising the step of:

mounting said stylus to said actuator such that it is substantially coaxial with an axis of said actuator.

36. The method as recited in claim 30, further comprising the steps of:

energizing a bias coil to bias said magnetostrictive member to said biased condition;

energizing a second coil to energize said magnetostrictive member to oscillate said stylus.

37. The method as recited in claim 30, further comprising:

energizing said magnetostrictive member to oscillate to at least its third harmonic and at a frequency of at least 5 Khz.

38. An engraver comprising:

an engraving head having a headstock and a tailstock for rotatably supporting a cylinder;

an engraving head having a housing and an actuator situated in the housing;

said engraving head comprising an energizer for energizing said actuator to cause a stylus associated with said actuator to oscillate in order to engrave a pattern on a surface of said cylinder;

said driver energizing said actuator to at least a third harmonic of said actuator.

39. The engraver as recited in claim 38 wherein said energizer further comprises at least one bias coil operatively associated with said engraving device for biasing said actuator to a biased length.

40. The engraver as recited in claim 39 wherein said actuator is generally elongated and comprises a length of less than six inches and a diameter of less than one inch.

41. The engraver as recited in claim 39 wherein said biased length is about one-half a total possible linear expansion limit of said actuator.

42. The engraver as recited in claim 38 wherein said actuator which is generally elongated and comprises a length of less than six inches and a diameter of less than one inch.

43. The engraver as recited in claim 38 wherein said engraving head operatives at a frequency of greater than 5 Khz.

44. The engraver as recited in claim 38 wherein said actuator comprises a magnetostrictive material.

45. The engraver as recited in claim 44 wherein said stylus is secured to a rigid arm which is pivotally coupled to said housing;

said rigid arm having a resonant frequency which is greater than the frequency of said engraving head.

46. The engraver as recited in claim 45 wherein said engraving head comprises at least one spring plate for pivotally coupling said rigid arm to said engraving head.

47. A method for engraving a cylinder comprising:

rotatably mounting a gravure cylinder at an engraving station of an engraver;

providing a magnetostrictive member in an engraving head situated at said engraving station, said magnetostrictive material having a stylus coupled thereto;

energizing said magnetostrictive material to cause said stylus to be displaced in a substantially linear operation range of modulation for said magnetostrictive material during rotation of the cylinder in order to engrave a predetermined pattern of engraved areas on a surface of the cylinder.

48. The method as recited in claim 47 further comprising:

compressing said magnetostrictive material such that said magnetostrictive material operates in said linear operating range of modulation.

49. The method as recited in claim 47 further comprising:

energizing said magnetostrictive material such that said stylus oscillates at a frequency in excess of 5 Khz.

50. The method as recited in claim 47 further comprising:

energizing said magnetostrictive material to oscillate at its third harmonic.

51. The method as recited in claim 47 further comprising:

situating said stylus on an arm having an arm resonant frequency;

energizing said magnetostrictive member at a frequency which is less than said arm resonant frequency.

52. The method as recited in claim 51 wherein said arm is rigid; said method further comprising:

pivotally coupling said arm to said engraving head;

energizing said magnetostrictive material to cause said arm to pivot towards and away from said cylinder.

53. The method as recited in claim 52 wherein said arm is rigid and is pivotally coupled to said engraving head with at least one spring.

* * * * *